United States Patent [19]

Prall

[11] Patent Number: 5,185,275
[45] Date of Patent: Feb. 9, 1993

[54] SNAP-BACK PREVENTING METHOD FOR HIGH VOLTAGE MOSFET

[75] Inventor: Kirk Prall, Boise, Id.

[73] Assignee: Micron Technology, Inc., Biose, Id.

[21] Appl. No.: 860,619

[22] Filed: Mar. 30, 1992

[51] Int. Cl.$^5$ .................................. H01L 21/265
[52] U.S. Cl. ....................................... 437/30; 437/57;
437/74; 437/29; 148/DIG. 126; 257/375;
257/901; 257/928
[58] Field of Search ............. 437/30, 57, 74, 29;
357/23.4

[56]     References Cited
U.S. PATENT DOCUMENTS 4,797,724  1/1989  Boler et al. .......................... 437/57

FOREIGN PATENT DOCUMENTS 0243472  9/1989  Japan ................................. 357/23.4

3-42874  2/1991  Japan .

Primary Examiner—Olik Chaudhuri
Assistant Examiner—Long Pham
Attorney, Agent, or Firm—Henri J. A. Charmasson

[57]     ABSTRACT

A process for improving the high voltage performances of a MOSFET transistor, and suppressing parasitic current induced snap-back behavior by placing a heavily doped P+ region around the grounded source. A first P+ region is placed adjacently to and in contact with the source and its metal lead, and a second P+ region may be placed under and in contact with the source and first P+ region, or form a layer under the entire transistor connected to the source by a P+ plug. Additional grounding of the source may be accomplished by a succession of alternating P+ region and N+ regions along the source edge.

4 Claims, 1 Drawing Sheet

SNAP-BACK PREVENTING METHOD FOR HIGH VOLTAGE MOSFET

FIELD OF THE INVENTION

This invention relates to the fabrication of integrated circuits, and more particularly to the fabrication of metal oxide field effect transistors MOSFET.

BACKGROUND OF THE INVENTION

High voltage MOSFET devices are subject to parasitic bulk substrate currents which may result in a phenomenon called snap-back causing a junction breakdown at the voltage level substantially below the rated device breakdown when the gate is grounded.

The snap-back phenomenon is believed to be the result of substrate currents causing the source to become forward biased.

SUMMARY OF THE INVENTION

The principal and secondary objects of this invention are to improve the high voltage characteristics of MOSFET devices by avoiding break-down at relatively low source to drain voltage due to snap-back phenomenon induced by parasitic substrate current with minimum side effects upon other device characteristics such as gain.

This and other valuable objects are achieved by shielding the source against parasitic substrate currents that could forward bias it. Several types and locations of NP barrier surrounding the source are proposed.

DESCRIPTION OF THE PREFERRED EMBODIMENTS OF THE INVENTION

Snap-back is a major problem in high voltage MOS devices that typically affects products such as non-volatile memories, linear circuits, etc. Snap-back is a weak function of channel length and is difficult to eliminate using typical process parameters such as implant doses.

Figure 1:
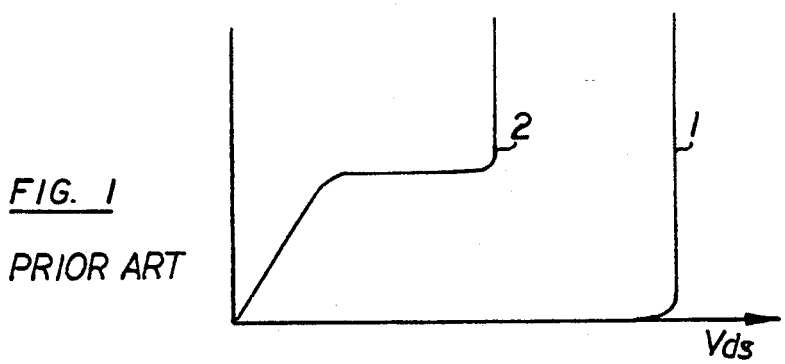
FIG. 1 is a diagram illustrating the parasitic snap-back behavior of the prior art MOSFET.

The typical behavior of a N-channel MOS devices is illustrated in the drain/source current versus the drain/source voltage graph of FIG. 1. The maximum voltage of the transistor is limited by punch-through or junction breakdown when the gate is grounded as shown by the first curve 1. The maximum voltage is significantly reduced by as much as fifty percent when the gate voltage is applied as illustrated by the second curve 2. This reduction in the breakdown voltage results in circuit failure, and potential reliability problems since the consequences can be destructive.

Snap-back is believed to be caused by forward-biasing of the source junction due to parasitic substrate currents. In a first scenario, the substrate current causes a significant voltage drop across the bulk resulting in a forward-biasing of the source. In a second scenario, it is believed that the substrate current reaching the source junction modulates the NP barrier height. This invention offers four different ways the structure of the transistor can be improved by shielding the source and preventing substrate current from reaching it.

Four source shielding methods are disclosed in connection with a N channel MOSFET device 3, having a source terminal 4, a drain terminal 5, a polysilicon gate structure 6 in the upper insulating oxide layer 7, and a P— substrate 8.

Figure 2:
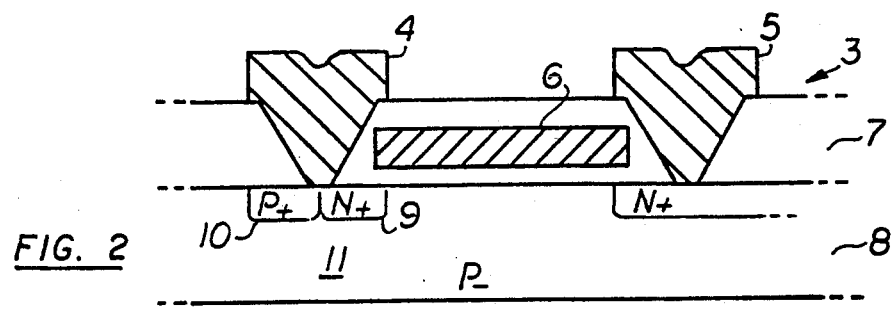
FIG. 2 is a diagrammatic illustration of a first type of current barrier.

FIG. 2 shows a first method in which the source junction 9 is merged with a P+ contact pad 10 in order to keep the area 11 of the substrate 8 surrounding the source at ground.

Figure 3:
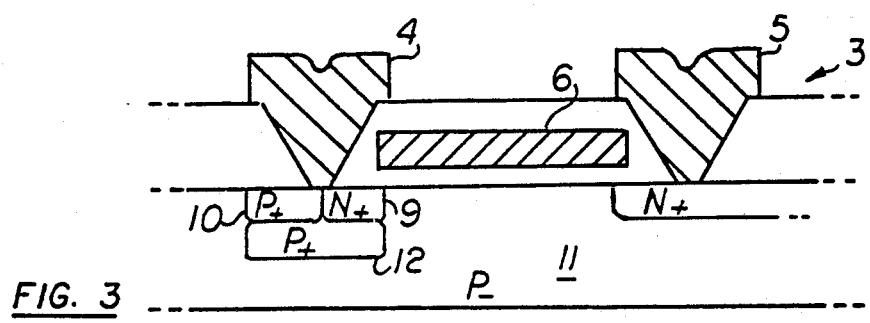
FIG. 3 is a diagrammatic illustration of a second type of current barrier.

A second type of improvement is illustrated in FIG. 3 where another P+ region 12 is diffused under the source of a N channel transistor. In this case, the source 9 is shielded on two sides, and the P+ barriers 10, 12 will collect some of the holes preventing them from reaching the source.

Figure 4:
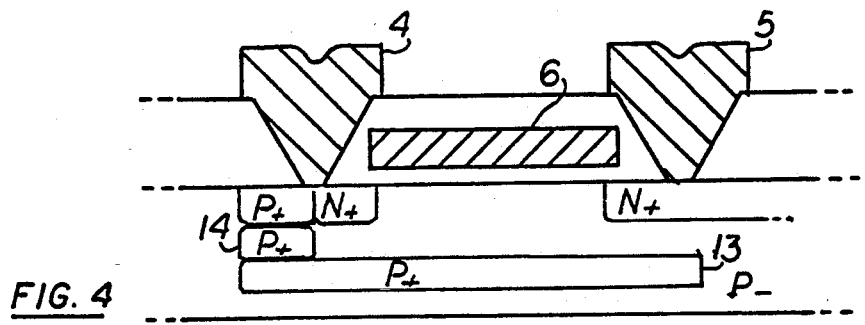
FIG. 4 is a diagrammatic illustration of a third type of current barrier.

A third method of improvement is illustrated in FIG. 4. In this method a highly doped layer 13 is laid under the entire transistor. The buried layer 13 is connected to the source by a P+ plug 14, this method is particularly indicated for BiCMOS fabrication processes where a buried layer and P+ plug is already used.

Figures 5, 6:
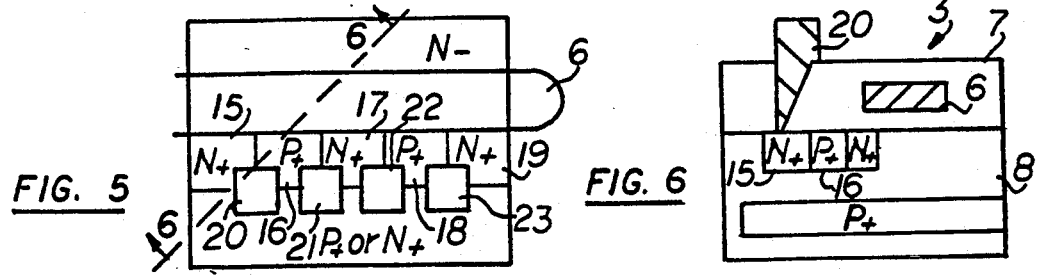
FIG. 5 is a diagrammatic illustration of a fourth type of current barrier.
FIG. 6 is a cross-sectional view taken along line 6—6 of FIG. 5.

A fourth alternate method of grounding the source is illustrated in FIGS. 5 and 6 where alternating N+ and P+ regions 15-19 are positioned along the edge of the source. The source connection consists of a series of spaced-apart leads 20-23, wherein each lead contacts the source and one each of said N+ and P+ alternating regions. This approach results in the grounding of the source, and the creation of hole traps on three of its sides of the source. The trade-off in this fabrication process is a reduced gain characteristic.

While the preferred embodiments of the invention have been described, modifications can be made and other embodiments may be devised without departing from the spirit of the invention and the scope of the appended claims.

What is claimed is:

1. In the fabrication of metal oxide field effect N-channel circuit having a source, channel and drain diffused over a bulk substrate, said source being in contact with a metal lead, a process for suppressing parasitic snap-back behavior of the circuit and for improving high voltage performance, said process comprising the steps of:
    placing a first P-region in contact with the source, wherein said P-region is more heavily doped than the bulk substrate by diffusing said P-region adjacently to said source and in contact with said metal lead, and
    placing a P layer, more heavily doped than said bulk substrate under the source, channel and drain; said layer being spaced-apart from said source, channel and drain; and
    placing a P-type plug above said layer and in contact with said layer and first P-region.

2. The process of claim 1, which further comprises placing an alternating succession of P regions and N regions adjacent to the source and in contact with the source and metal lead.

3. The process of claim 2, which further comprises forming said metal lead in a series of pads, each pad being in contact with the source and adjacent P region and N regions.

4. In the fabrication of metal oxide field effect N-channel circuit having a source, channel and drain diffused over a bulk substrate, said source being in contact with a metal lead, a process for suppressing parasitic snap-back behavior of the circuit and for improving high voltage performance, said process comprising the steps of:

placing a first P-region in contact with the source, wherein said P-region is more heavily doped than the bulk substrate by diffusing said P-region adjacently to said source and in contact with said metal lead; and placing a P layer, more heavily doped than said bulk substrate under the source, channel and drain;

said layer being spaced-apart from said source, channel and drain;

placing a P-type plug above said layer and in contact with said layer and first P-region; and placing a second P-region under said source and in contact with underside area of said first P-region and said source.

* * * * *